US005735039A

United States Patent [19]

Shuey et al.

[11] Patent Number: 5,735,039

[45] Date of Patent: Apr. 7, 1998

[54] METHOD OF REMOVING ELECTRICAL TERMINALS FROM A CIRCUIT BOARD

[75] Inventors: Todd Alan Shuey, Camp Hill; John Douglas Weary, Mechanicsburg, both of Pa.

[73] Assignee: The Whitaker Corporation, Wilmington, Del.

[21] Appl. No.: 610,098

[22] Filed: Feb. 29, 1996

[51] Int. Cl.[6] .............................. H05K 3/00; B23P 19/00

[52] U.S. Cl. ............................ 29/829; 29/845; 29/426.5; 29/426.6; 29/762; 29/764

[58] Field of Search ............................ 29/842, 845, 762, 29/764, 829, 402.03, 402.08, 426.5, 426.6

[56] References Cited

U.S. PATENT DOCUMENTS

| | | | |
|---|---|---|---|
| 4,864,721 | 9/1989 | Rudy, Jr. et al. | 29/764 |
| 4,904,212 | 2/1990 | Durbin et al. | 29/845 |
| 5,152,052 | 10/1992 | Rantala et al. | 29/764 |
| 5,402,563 | 4/1995 | Satoh et al. | 29/829 |

OTHER PUBLICATIONS

AMP Incorporated—IS 2636/AMP Contact Replacement Tool 265871 Action Pin Contacts.

AMP Incorporated—IS 2933/AMP Pace Contact Replacement Tools 59946–1 & 266220–1.

AMP Incorporated—IS 6881/AMP Pace Connector Contact Replacement Tools 59960–1 & 266220–3.

AMP Incorporated—IS 9185/AMP Contact Removal Tool 58209–1 for Action Pin Contacts.

*Primary Examiner*—P. W. Echols
*Attorney, Agent, or Firm*—Katherine A. Nelson

[57] ABSTRACT

A method of removing electrical terminals (14) having a compressible compliant section (16) disposed within a circuit board through-hole (46) in an interference fit, the terminal insertion end (18) projecting from the through-hole (46) and beyond a remote surface (44) thereof when fully inserted. The method includes the steps of: providing a tool (50)having a work surface (54) including an array of work sites (56), each associated with a terminal (14); urging the work surface (54) of the tool (50) against the remote side (44) of the board (40) and performing a work step on the insertion end (18) to at least temporarily alter the insertion end at the through-hole exit thereby reducing the retention force; and pulling the terminal (14) from the through-hole from the insertion side (42) of the board. In one embodiment an aperture (56) in the tool (50) is dimensioned to receive the insertion end and the alternation step includes compressing the outwardly extending portion of the compliant section. In another embodiment the alteration step severs the insertion end of the terminal.

4 Claims, 2 Drawing Sheets

METHOD OF REMOVING ELECTRICAL TERMINALS FROM A CIRCUIT BOARD

FIELD OF THE INVENTION

This invention is directed to a method for removing electrical terminals from a circuit board and more particularly to a method to effect removal of a connector from a circuit board.

BACKGROUND OF THE INVENTION

One frequently used technique for mounting connectors to circuit boards is the use of electrical terminals having compliant sections that are inserted into plated through-holes of a circuit board and are secured therein by an interference fit between the compliant section and the walls of the circuit board through-holes. When and if it becomes necessary to remove a single terminal or an entire connector from a board to repair or replace the connector it is desirable to remove that connector without damaging the circuit board.

SUMMARY OF THE INVENTION

The present invention is directed to a method for removing terminals having compliant sections from a circuit board. The terminal is of the type having a compliant section adjacent to the insertion end thereof. When the terminal is fully inserted into a through-hole of the circuit board, the insertion end projects at the exit of the through-hole of the board and beyond the remote surface thereof. The compliant section is defined by a pair of legs joined at said insertion end to close a gap therebetween such that the joint assists in resisting compression of said compliant section. The compliant section itself is disposed within the circuit board through-hole and is in an interference fit within the hole. The method includes the steps of: providing a tool having a work surface including an array of work sites, each associated with one of the terminals; urging the work surface of the tool against the remote side of the board and performing a work step on the insertion end to at least temporarily alter the insertion end at the through-hole exit thereby reducing said retention force; and pulling at least one contact from an insertion side of the board.

In one embodiment the work site includes an end receiving aperture having sidewalls at least at the entrance thereof dimensioned to be less than the through-hole diameter and therefore less than the dimension of the compliant section compressed therein and the alteration step includes receiving at least one terminal insertion end into an associated receiving end receiving aperture such that the sidewalls of the aperture entrance engage side surfaces of the contact insertion end and compress the compliant section at the through-hole exit thereby reducing the retention force.

In another embodiment the tool includes cutting surfaces that engage opposite sides of the compliant section at the exit of the through-hole and upon operation of the tool the outwardly extending end portion of the terminal is severed and removed from the compliant section.

Embodiments of the invention will now be described by way of example with reference to the accompanying drawings.

DETAILED DESCRIPTION OF THE DRAWINGS

Figure 1:
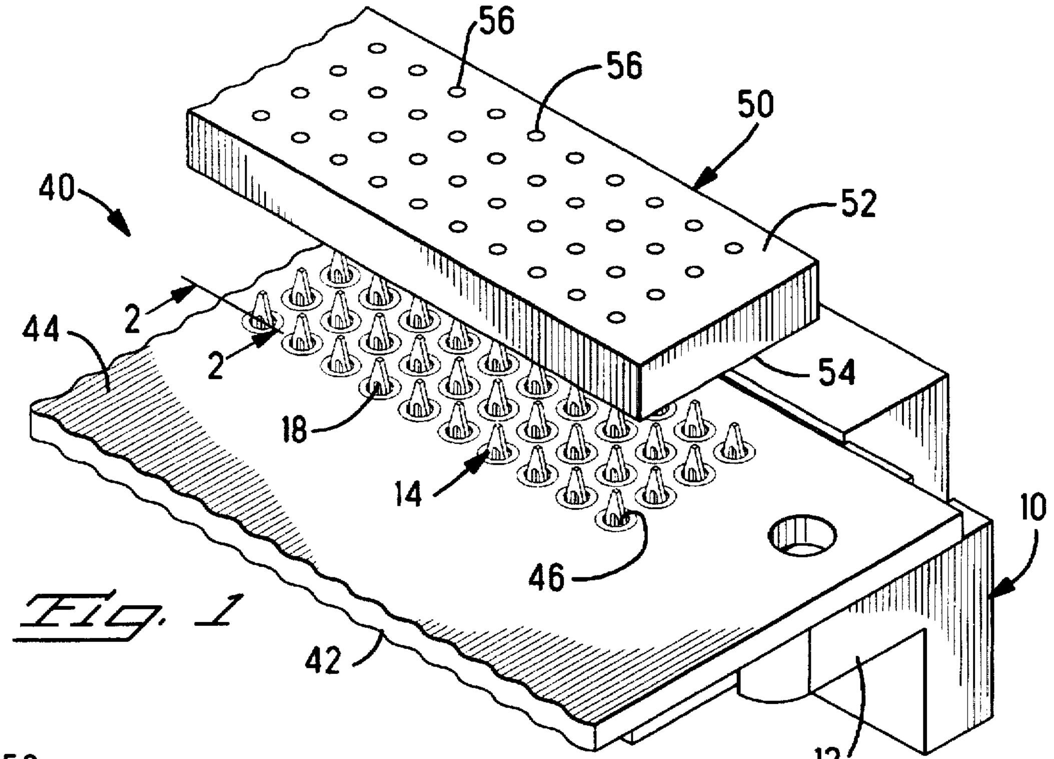
FIG. 1 is an isometric view of the remote side of the circuit board having a connector mounted to the other side thereof and illustrating the outwardly extending insertion ends of the compliant terminals used to mount the connector to a board and further having a work tool positioned above the board.

The method of removing compliant pin contacts in accordance with the invention is being shown with reference to a right angle connector 10 having housing 12 and a plurality of terminals 14 disposed therein and mounted to a circuit board 40 from an insertion side 42 thereof. As shown in FIGS. 1 through 4, each terminal 14 includes a compliant section 16 disposed within a respective through-hole 46 of circuit board 40 and an insertion end 18 that extends outwardly from the through-hole 46 when the connector 10 is fully mounted to the board 40.

Figure 2:
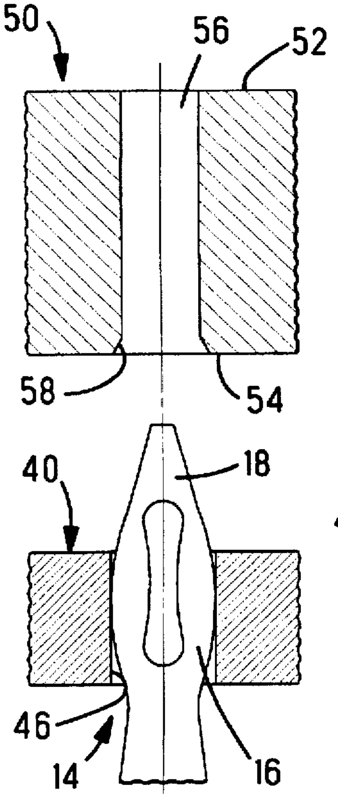
FIG. 2 is a cross-sectional view taken along line 2—2 of FIG. 1 illustrating the work tool above the insertion end of one of the terminals.
Figure 3:
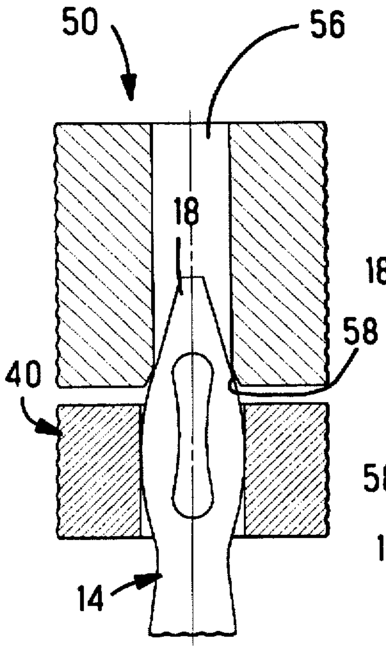
FIG. 3 is a cross-sectional view similar to that of FIG. 2 with the tool positioned over the leading end of the compliant pin.
Figure 4:
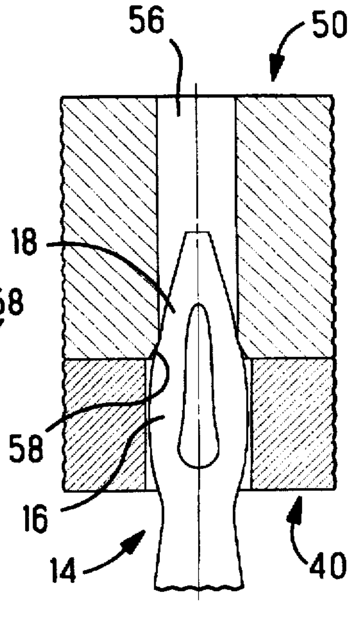
FIG. 4 is a cross-sectional view similar to that of FIG. 3 showing the work tool moved onto the insertion end of the terminal and flush with the remote side of the circuit board and illustrating the compressed compliant section.

FIGS. 1 through 4 illustrate use of a tool 50 having first and second major surfaces 52, 54 and an array of work sites, which in this embodiment are a plurality of end receiving apertures 56 extending therethrough. As can be seen in FIGS. 2 through 4 apertures 56 are tapered at the aperture entrance 58 to provide a lead end for receiving the insertion ends of the terminals 14. The diameter of the apertures 56 are selected to be smaller than the diameters of the circuit board through-holes 46 at least at the entrance thereof and therefore less than the dimension of the compliant section 16 compressed therein.

FIGS. 2 through 4 illustrate the use of the tool 50. As can be seen from these Figures, the tool 50 includes a work surface 54 which is positioned proximate the remote face 44 of the circuit board 40 with the respective apertures 56 positioned over corresponding insertion ends 18 of the respective terminals 14. The tapered lead end surfaces 58 are moved against the outer surfaces of the compliant sections 16 and are engaged therewith. As the tool 50 is urged against the circuit board 40, the sidewalls 58 of apertures 56 and the tapered leading entrance surfaces 58 compress the compliant section 16 at the through-hole exit thus reducing the retention force of the terminal 14 in the board through-hole 46. The terminal 14 can their be removed from the insertion side of the board.

In the preferred embodiment the tool 50 includes an array of apertures 56 corresponding to the array of terminals 14 in a respective connector 10. Upon full insertion of the tool 50, all of the compliant terminals are compressed thus reducing the retention force of the terminals in the board and facilitating the removal of connector 10 from the board 40.

Figure 5:
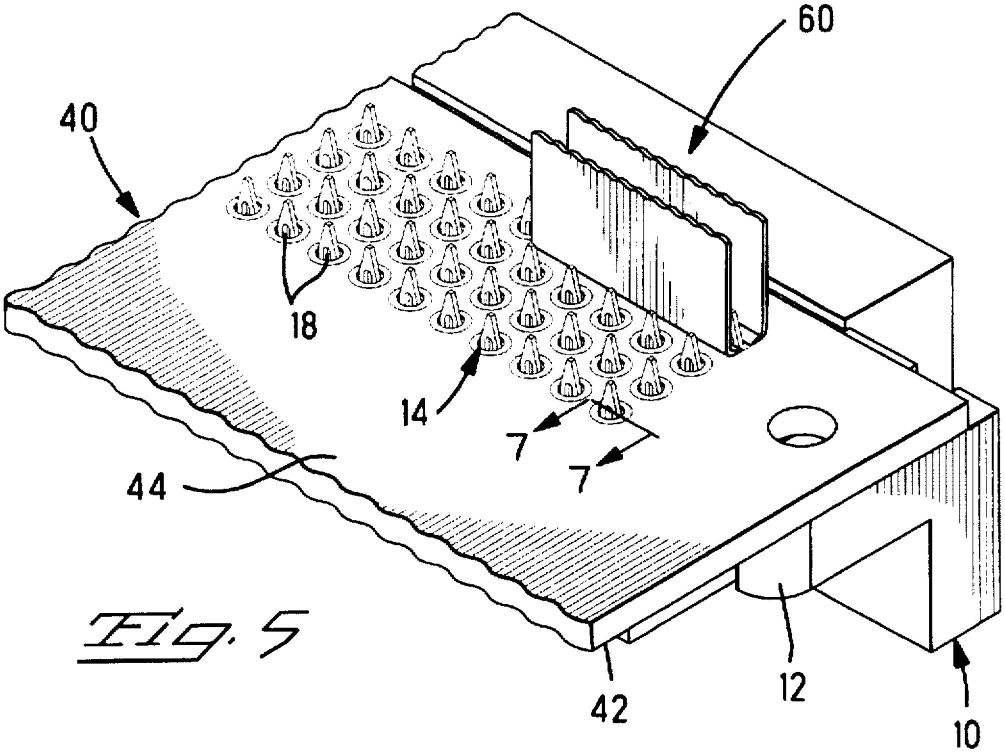
FIG. 5 is an isometric view similar to that of FIG. 1 illustrating another embodiment of a work tool positioned on a plurality of terminals.
Figure 6:
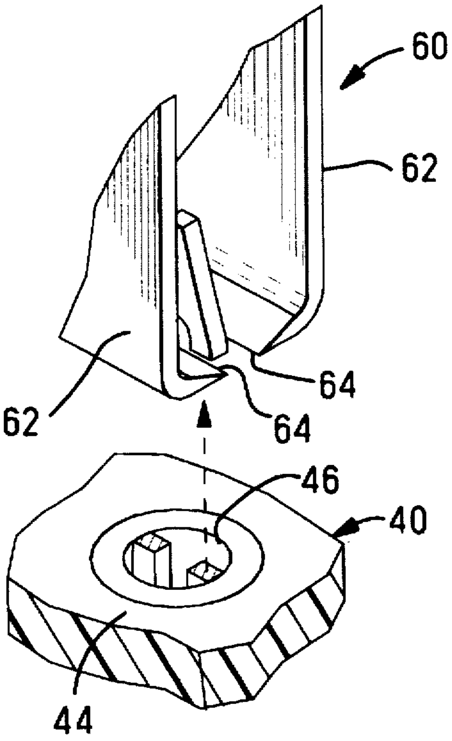
FIG. 6 is an enlarged fragmentary portion of FIG. 5.
Figure 7:
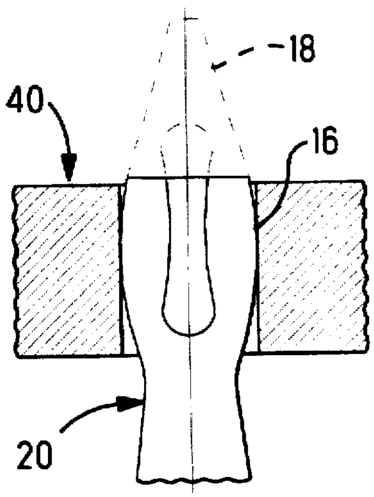
FIG. 7 is a cross-sectional view illustrating the truncated compliant section in the circuit board with the leading end shown in phantom.

Referring now to FIGS. 5 through 7, a second embodiment 60 of the tool is shown positioned over the same connector and board arrangement as previously described. In this embodiment the tool 60 is positioned over a plurality of the insertion ends 18 of the terminals 14. For purposes of illustrating the invention tool 60 is shown with portions of two blades 62 having cutting edges 64 at the lower edges thereof. The other ends of the blades 62 are attached to handles (not shown) or the like that operate in a manner similar to that of pliers. Upon closing the tool 60 and bringing the blades 62 together, the respective cutting edges 64 remove outwardly extending leading ends 18 of the compliant terminals thereby reducing the retention force of the remaining compliant sections 16.

Tool 50 is preferably made from tool steel of sufficient thickness to receive the insertion end therein. The tool has the advantage of being able to receive an array of terminals or insertion ends of terminals and simultaneously compress them so that the connector 10 may be removed as a unit.

It is to be understood, however, in many instances an individual or selected terminals may be removed to replace and repair the connector without removing the entire connector from the board.

It is thought that the method of removing electrical terminals from a circuit board in accordance with the present invention and many of its attendant advantages will be understood from the foregoing description. It is apparent that various changes may be made in the form, construction, and arrangement of the tools, connectors and terminals used in conjunction with the method without departing from the spirit or scope of the invention, or sacrificing all of its material advantages.

We claim:

1. A method of removing electrical terminals from a circuit board, each terminal being of the type having a compressible compliant section adjacent an insertion end thereof, said insertion end projecting from a through-hole of the board at the exit thereof and beyond a remote surface of the board when fully inserted, with said compliant section disposed within a circuit board through-hole in an interference fit creating a retention force with a portion of said compliant section extending beyond the remote board surface, said compliant section defined by a pair of legs joined at said insertion end to close a gap therebetween such that the joint assists in resisting compression of said compliant section, the method comprising the steps of:

providing a tool having a work surface including an array of work sites, each associated with one of said terminals;

urging the work surface of said tool against the remote side of said board and performing an alteration step on said insertion end to at least temporarily reduce said retention force; and pulling at least one said terminal from said through-hole from an insertion side of said board; whereby the reduced retention force facilitates terminal removal.

2. The method of claim 1 wherein said alteration step consists of the step of severing the insertion end of said compliant section.

3. The method of claim 1 wherein said work site includes an end receiving aperture having side walls at least at the entrance thereof being dimensioned to be less than the through-hole diameter and therefore less than the dimension of said compliant section compressed therein and said alteration step includes the step of receiving at least one terminal insertion end into the associated end receiving aperture such that said side walls of the aperture entrance engage side surfaces of the terminal insertion end, and compress said compliant section portion.

4. A method of removing electrical terminals from a circuit board, each terminal being of the type having a compressible compliant section adjacent an insertion end thereof, said insertion end projecting from a through-hole of the board at the exit thereof and beyond a remote surface of the board when fully inserted, with said compliant section disposed within a circuit board through-hole in an interference fit creating a retention force with a portion of said compliant section extending beyond the remote board surface, the method comprising the steps of:

providing a tool having a work surface including an array of work sites, each associated with one of said terminals, said work site including an end receiving aperture having side walls at least at the entrance thereof being dimensioned to be less than the through-hole diameter and therefore less than the dimension of said compliant section compressed therein;

urging the work surface of said tool against said remote side of said board and receiving at least one terminal insertion end into the associated end receiving aperture such that said side walls of the aperture entrance engage side surfaces of said terminal insertion end, and compress said compliant section portion at said through-hole exit thereby reducing said retention force; and pulling at least one said terminal from said through-hole from an insertion side of said board; whereby said reduced retention force facilitates terminal removal.

* * * * *